(12) United States Patent  (10) Patent No.: US 7,602,878 B2
Moreaux et al.  (45) Date of Patent: Oct. 13, 2009

(54) BINARY FREQUENCY DIVIDER

(75) Inventors: Christophe Moreaux, Simiane (FR); Ahmed Kari, Tourves (FR); David Naura, Aix en Provence (FR); Pierre Rizzo, Aix en Provence (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 12/141,798

(22) Filed: Jun. 18, 2008

(65) Prior Publication Data

US 2009/0022260 A1 Jan. 22, 2009

Related U.S. Application Data

(63) Continuation-in-part of application No. PCT/FR2006/002604, filed on Nov. 28, 2006.

(30) Foreign Application Priority Data

Dec. 22, 2005 (FR) .................................. 05 13121

(51) Int. Cl.
*H03K 21/00* (2006.01)

(52) U.S. Cl. .......................................... 377/47; 377/48
(58) Field of Classification Search ........................ None
See application file for complete search history.

(56) References Cited

U.S. PATENT DOCUMENTS

| 4,935,944 | A | | 6/1990 | Everett |
| 5,524,035 | A | * | 6/1996 | Casal et al. .................... 377/47 |
| 5,822,596 | A | * | 10/1998 | Casal et al. ................. 713/322 |
| 6,998,882 | B1 | * | 2/2006 | Chung ........................ 327/115 |
| 7,215,211 | B2 | * | 5/2007 | Lipan et al. ................... 331/34 |
| 7,358,782 | B2 | * | 4/2008 | Khanoyan et al. ........... 327/117 |
| 2001/0043665 | A1 | | 11/2001 | Stehle |

FOREIGN PATENT DOCUMENTS

EP 1 300 949 A1 4/2003

OTHER PUBLICATIONS

Specification for RFID Air Interface, EPC Global—Powered by GS1, EPC Radio-Frequency Identity Protocols Class-1 Generation-2 UHF RFID Protocol for Communications at 860 MHz-960 MHz Version 1.0.9, Jan. 2005, 94 pages.

* cited by examiner

*Primary Examiner*—Tuan Lam
(74) *Attorney, Agent, or Firm*—Lisa K. Jorgenson; Robert Iannucci; Seed IP Law Group PLLC (57) ABSTRACT

A binary frequency divider includes a counter paced by an input signal, means for comparing a counting value with first and second threshold values and supplying first and second control signals synchronized with variation edges of a first type of the input signal. The divider includes means for supplying at least one third control signal shifted by a half-period of the input signal in relation to one of the first or second control signals, and control means for generating the output signal using control signals chosen according to the value of at least one least significant bit of the division setpoint. Application is mainly but not exclusively to UHF transponders.

24 Claims, 4 Drawing Sheets

| PH | b1b0 | SET | RST | ST0 | ST1 |
|----|------|-------|-------|------|------|
| 0 | 00 | DET1 | DET2 | 0 | DET2 |
| 1 | 00 | DET1 | DET2 | 0 | DET2 |
| 0 | 01 | SDET1 | DET2 | 0 | DET2 |
| 1 | 01 | DET1 | SDET2 | DET2 | 0 |
| 0 | 10 | SDET1 | DET2 | 0 | DET2 |
| 1 | 10 | SDET1 | DET2 | 0 | DET2 |
| 0 | 11 | SDET1 | DET2 | 0 | DET2 |
| 1 | 11 | DET1 | SDET2 | DET2 | 0 |

BINARY FREQUENCY DIVIDER

TECHNICAL FIELD

The present disclosure generally relates to a hard-wired logic binary frequency divider receiving an input signal of a determined frequency and supplying an output signal having a frequency lower than the input frequency.

BACKGROUND INFORMATION

Hard-wired logic binary frequency dividers offer the advantage of being simple in structure, inexpensive to implement and occupying a low surface area of silicon. This simplicity is offset by the fact that they have various limitations. In particular, the period of the output signal they supply can only be incremented by a constant value equal to the period of the input signal that is applied thereto. Similarly, the duty cycle of the output signal is not totally constant and varies according to the value of a division setpoint that is applied thereto.

Figure 1A:
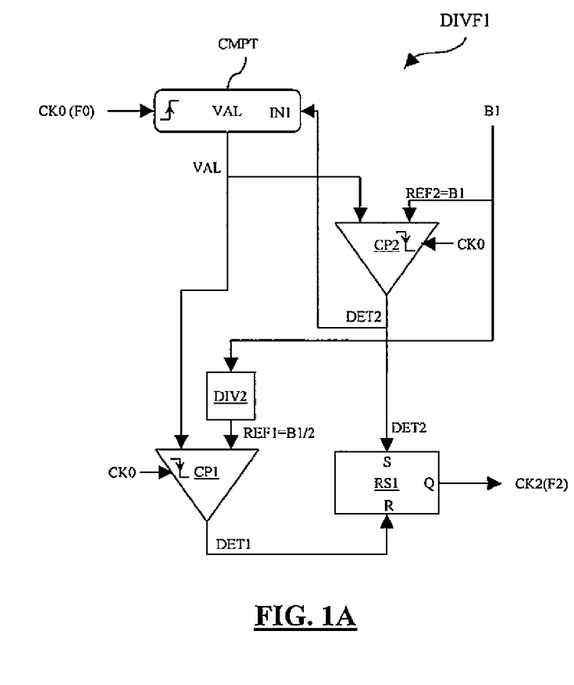
FIGS. 1A, 1B described above respectively represent a classic binary frequency divider and a detail of an embodiment of an element of the divider.

This will be better understood with reference to FIG. 1A that represents the classic structure of a binary frequency divider DIVF1. The divider is arranged here for supplying an output signal having a duty cycle of 0.5 and operates with 4 bits. It comprises a binary counter CMPT, a divider DIV2, two synchronous comparators CP1, CP2 and an RS-type asynchronous flip-flop RS1. The counter CMPT is paced by an input signal CK0 of frequency F0 and supplies a counting value VAL that is incremented upon each rising edge of the signal CK0. The counting value VAL is applied to an input of each comparator CP1, CP2. The comparator CP1 receives a threshold value REF1 at a second input and the comparator CP2 receives a threshold value REF2 at a second input. The threshold value REF1 is equal to B1/2 and is supplied by the divider DIV2 using the setpoint B1. The threshold value REF2 is equal to the setpoint B1.

Figure 1B:
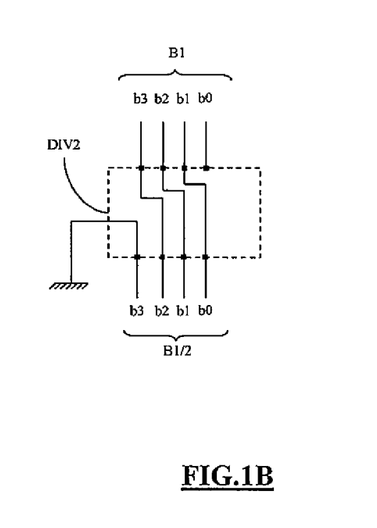

As represented in FIG. 1B, the divider DIV2 is an asynchronous shift circuit that performs a division by 2 of the setpoint B1 by performing a right shift of the bits b3, b2, b1, b0 of the setpoint without any carry after the decimal point, such that the rounding error on the threshold value REF1 is equal to 1 for an odd figure and is equal to 0 for an even figure.

The comparator CP1 supplies a control signal DET1 synchronized with the falling edges of the signal CK0 and the comparator CP2 supplies a control signal DET2 also synchronized with the falling edges of the signal CK0. The signal DET1 is applied to the R input of the flip-flop RS1 (reset input for resetting to 0) and the signal DET2 applied to the S input of the flip-flop RS1 (set input for setting to 1). The signal DET2 is applied to an input IN1 of the counter CMPT as a reset signal for resetting the counter to 1. The output signal CK2, of frequency F2=F0/B1, is supplied by a Q output of the flip-flop RS1.

Figure 2:
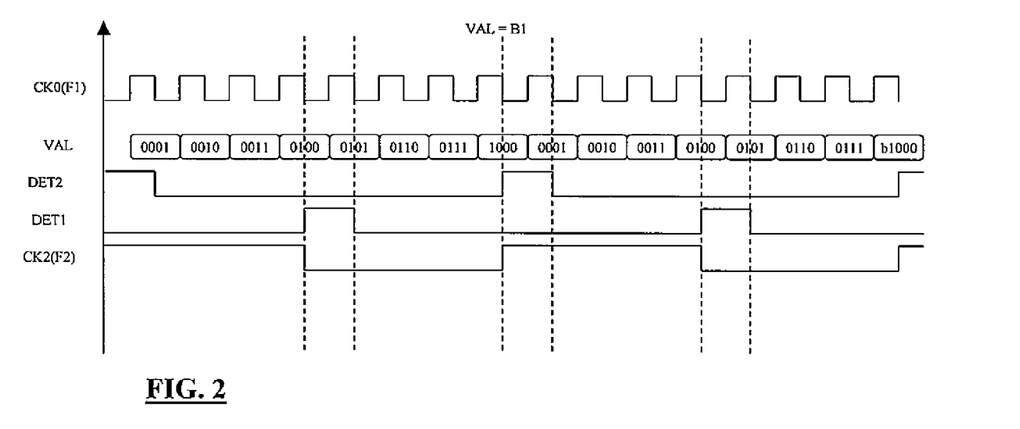
FIG. 2 is a timing diagram representing binary signals or values appearing in the frequency divider in FIG. 1A.

FIG. 2 represents the shape of the signals CK2, DET1, DET2 and the counting value VAL according to the input signal, for a setpoint B1 equal to 8 (i.e., 1,000 in binary). The signal CK2 changes to 0 when the control signal DET1 changes to 1 and changes to 1 when the control signal DET2 changes to 1, in synchronization with the falling edges of the signal CK0, while the resetting to 1 of the counting value occurs on the rising edge of the signal CK0, like its incrementation.

Due to the rounding error on the binary division, the duty cycle of the output signal CK2 is exactly equal to 0.5 for an even value of the setpoint B (example represented) but is shifted by a period T0 of the signal CK0 (T0=1/F0) for the odd values of the setpoint. Indeed, the division by 2 of an odd value without any carry after the decimal point gives the same result as the division by 2 of the previous even value. For example, the division of 4 (0100) gives 2 (0010) and the division of 5 (0101) also gives 2 (0010) since the least significant bit of the setpoint is removed by the right shift. The precision of the duty cycle therefore varies according to the period T0 of the input signal CK0 and to the division setpoint. The higher the division setpoint is, the lower the error on the duty cycle.

Furthermore, the step of the period T2 of the output signal CK2 (minimal increment) is equal to the period T0 of the input signal. Indeed if the setpoint B1 changes from a value B to a value B+1, the period T2 of the output signal CK2 changes from B*T0 to (B+1)*T0, i.e., B*T0+T0. The corresponding frequency step, equal to $F0/B^2+B$, also depends on the input frequency F0 although not linear and varying according to the value B of the setpoint B1.

Given that the current consumption of such a divider increases in proportion to the input frequency F0, it is desirable, in practice, to choose a frequency F0 that is as low as possible for an output frequency F2 that is generally determined by specifications.

Thus, generally speaking, the minimal frequency F0 to be applied to the input of the divider is determined according to the characteristics of the output signal CK2.

For example, within the scope of the production of a passive-type RFID contactless integrated circuit conforming to the EPC™-GEN2 ("*Radio-Frequency Identity Protocols Class-1 Generation-2—UHF RFID Protocol for Communications at 860 MHz-960 MHz*") industrial specification, the present inventors were confronted with the need to provide a frequency divider circuit supplying an output signal CK2 having a duty cycle between 0.4 and 0.6, the period of which can be adjusted by steps of 200 ns and having a minimal period T2 of 1.2 microseconds.

A step of 200 ns for the period of the output signal thus imposes a period T0 of the input signal of 200 ns, i.e., an input frequency F0 of 5 MHz (1/T0). The minimal period T2 of 1.2 microseconds corresponds to a frequency F2 of 833 KHz and imposes a division setpoint equal to 6. With a minimal division setpoint equal to 6, the maximal error on the duty cycle, for the odd value setpoint the closest to 6, e.g, 7, is of a half-period of the input signal over seven periods in total, e.g, a 7% error within the tolerance range defined by the specifications.

However, an input frequency F0 of 5 MHz is a very high frequency implying considerable current consumption, little compatible with an application to a passive transponder that is electrically powered using an ambient electric field sent by a contactless integrated circuit reader.

BRIEF SUMMARY

Thus, one embodiment provides a method for dividing binary frequency and a binary frequency divider structure that enables the input frequency to be decreased without losing precision in terms of the fineness of the frequency step and the error on the duty cycle.

One embodiment provides a method for dividing the frequency of an input signal and supplying an output signal having a frequency lower than the input frequency, comprising: defining a division setpoint, defining a first threshold value and a second threshold value that vary according to the division setpoint, incrementing a counting value at the pace of the input signal, comparing the counting value with the first threshold value and with the second threshold value and producing, in synchronization with variation edges of a first type of the input signal, a first control signal and a second control signal, the method further comprising producing at least one third control signal shifted by a half-period of the input signal in relation to one of the first or second control signals, and generating the output signal using control signals chosen according to the value of at least one least significant bit of the division setpoint, so as to adjust the period of the output signal or the duty cycle of the output signal with a precision at least equal to the half-period of the input signal.

According to one embodiment, the method comprises producing a third control signal shifted by a half-period of the input signal in relation to the first control signal, producing a fourth control signal shifted by a half-period of the input signal in relation to the second control signal, producing a fifth control signal of a frequency equal to half the frequency of the output signal, and generating the output signal using control signals chosen from the four control signals according to the value of at least two least significant bits of the division setpoint and of the value of the fifth control signal.

According to one embodiment, the method comprises cyclically resetting the counting value to 0 or to 1 according to the value of the least significant bits of the division setpoint and to the value of the fifth control signal.

According to one embodiment, the output signal is controlled by an asynchronous hard-wired logic circuit receiving at input the five control signals and at least the least significant bit of the division setpoint, and supplying reset signals and set signals for resetting and setting the output signal respectively to 0 and to 1.

According to one embodiment, the frequency of the output signal is equal to the frequency of the input signal divided by the division setpoint and multiplied by two, the first threshold value is equal to the result of the binary division by 4 of the division setpoint, without any carry after the decimal point, and the second threshold value is equal to the result of the binary division by 2 of the division setpoint, without any carry after the decimal point.

According to one embodiment, the frequency of the output signal is equal to the frequency of the input signal divided by the division setpoint, the first threshold value is equal to the result of the binary division by 2 of the division setpoint, without any carry after the decimal point, and the second threshold value is equal to the division setpoint.

One embodiment also relates to a hard-wired logic binary frequency divider, receiving an input signal having a determined frequency and supplying an output signal having a frequency lower than the input frequency, and comprising an input for receiving a division setpoint, a counter paced by the input signal, containing a counting value, means for supplying a first and a second threshold value according to the division setpoint, means for comparing the counting value with the first and second threshold values and supplying first and second control signals synchronized with variation edges of a first type of the input signal, means for supplying at least one third control signal shifted by a half-period of the input signal in relation to one of the first or second control signals, and control means for generating the output signal using control signals chosen according to the value of at least one least significant bit of the division setpoint, such that the step of the period of the output signal or the duty cycle of the output signal can be adjusted with a precision at least equal to the half-period of the input signal.

According to one embodiment, the divider comprises means for supplying a third control signal shifted by a half-period of the input signal in relation to the first control signal, means for supplying a fourth control signal shifted by a half-period of the input signal in relation to the second control signal, means for producing a fifth control signal of a frequency equal to half the frequency of the output signal, and the control means are arranged for generating the output signal using control signals chosen from the four control signals according to the value of at least two least significant bits of the division setpoint and of the value of the fifth control signal.

According to one embodiment, the control means supply signals so as to cyclically reset the counter with a counting value equal to 0 or equal to 1 according to the value of the least significant bits of the division setpoint and of the value of the fifth control signal.

According to one embodiment, the control means comprise an asynchronous hard-wired logic circuit receiving at input the five control signals and at least the least significant bit of the division setpoint, and supplying reset signals and set signals for resetting and setting the output signal respectively to 0 and to 1.

According to one embodiment, the divider comprises a first binary divider for supplying the first threshold value using the division setpoint, a second binary divider for supplying the second threshold value using the division setpoint, a first logic comparator synchronized with the variation edges of the first type of the input signal, supplying the first control signal when the counting value is equal to the first threshold value, a second logic comparator synchronized with the variation edges of the first type of the input signal, supplying the second control signal when the counting value is equal to the second threshold value, a first flip-flop synchronized with variation edges of a second type of the input signal, receiving the first control signal and supplying the third control signal, a second flip-flop synchronized with the variation edges of the second type of the input signal, receiving the second control signal and supplying the fourth control signal, and a divider by two synchronized with the variation edges of the second type of the input signal, receiving the third control signal and supplying the fifth control signal.

According to one embodiment, the frequency of the output signal is equal to the frequency of the input signal divided by the division setpoint and multiplied by two, the first threshold value is equal to the result of the binary division by 4 of the division setpoint without any carry after the decimal point, and the second threshold value is equal to the result of the binary division by 2 of the division setpoint without any carry after the decimal point.

According to one embodiment, the frequency of the output signal is equal to the frequency of the input signal divided by the division setpoint, the first threshold value is equal to the result of the binary division by 2 of the division setpoint, without any carry after the decimal point, and the second threshold value is equal to the division setpoint.

An embodiment also relates to an integrated circuit, such as a passive transponder, comprising a divider according to one embodiment.

According to one embodiment, the input signal of the divider is an internal clock signal, the divider is arranged for supplying an output signal the frequency of which is equal to the input frequency divided by the division setpoint and multiplied by two, and the division setpoint is supplied by a counting circuit for counting the number of periods of the internal clock signal occurring during an external event, divided by a predetermined value.

BRIEF DESCRIPTION OF THE SEVERAL VIEWS OF THE DRAWINGS

These and other features will be explained in greater detail in the following description of a binary divider according to one or more embodiments, given in relation with, but not limited to the following figures, in which.

DETAILED DESCRIPTION

In the following description, numerous specific details are given to provide a thorough understanding of embodiments. The embodiments can be practiced without one or more of the specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

A first technical limitation of a classic binary divider as represented in FIG. 1A is imposed by the need to synchronize the steps of incrementing the counting value VAL and the steps of producing the control signals DET1, DET2.

For this reason, the counting value VAL is incremented on the rising edge of the input signal CK0 while the control signals DET1, DET2 are supplied on the falling edge of the signal CK0 (or vice-versa). As the output signal CK2 is generated using control signals DET1, DET2, the variations of the output signal (rising edges and falling edges) are inevitably synchronized on edges of a same type of the input signal, here falling edges. The result is that the duty cycle of the output signal CK2 and the period T2 of the output signal CK2 cannot be adjusted with a better precision than the period T0 of the input signal CK0.

According to a first aspect of one embodiment, a frequency divider is produced to receive an input signal CK1 of frequency F1 and supplying an output signal CK2 of frequency F2 using additional control signals that are shifted by a half-period of the input signal in relation to the classic control signals DET1, DET2. The output signal CK2 is generated using both the additional control signals and the control signals DET1, DET2. Such a feature enables the time intervals elapsing between the rising and falling variation edges of the output signal to be adjusted to within a half-period, so as to adjust the period of the output signal or the duty cycle of the output signal with a precision of a half-period of the input signal.

More particularly, this feature offers two possibilities:

adjusting the duty cycle to within a half-period so as to correct the rounding error appearing with the odd value division setpoints, without modifying the step of the period T2 of the output signal, or adjusting the period T2 of the output signal to within a half-period of the input signal CK1 and supplying an output frequency F2 equal to the input frequency divided by the division setpoint and multiplied by 2, i.e., F2=2*F1/B, "B" being the value of the division setpoint, without increasing the error on the duty cycle (for an identical output frequency).

The second possibility, forming the second aspect of one embodiment, may be used for applications in which the current consumption of the divider must be reduced. Indeed, as seen above, the step dT of the period T2 of the output signal, generally fixed by specifications, imposes in a classic divider a minimal frequency equal to 1/dT at the input of the divider. However, if the output frequency F2 is equal to 2F1/B instead of F1/B, the step dT then imposes a minimal input frequency equal to ½*dT, i.e., half the minimal input frequency of a classic divider. The divider can therefore be paced by an input signal the frequency of which is divided by two, for an identical output signal.

Figure 3:
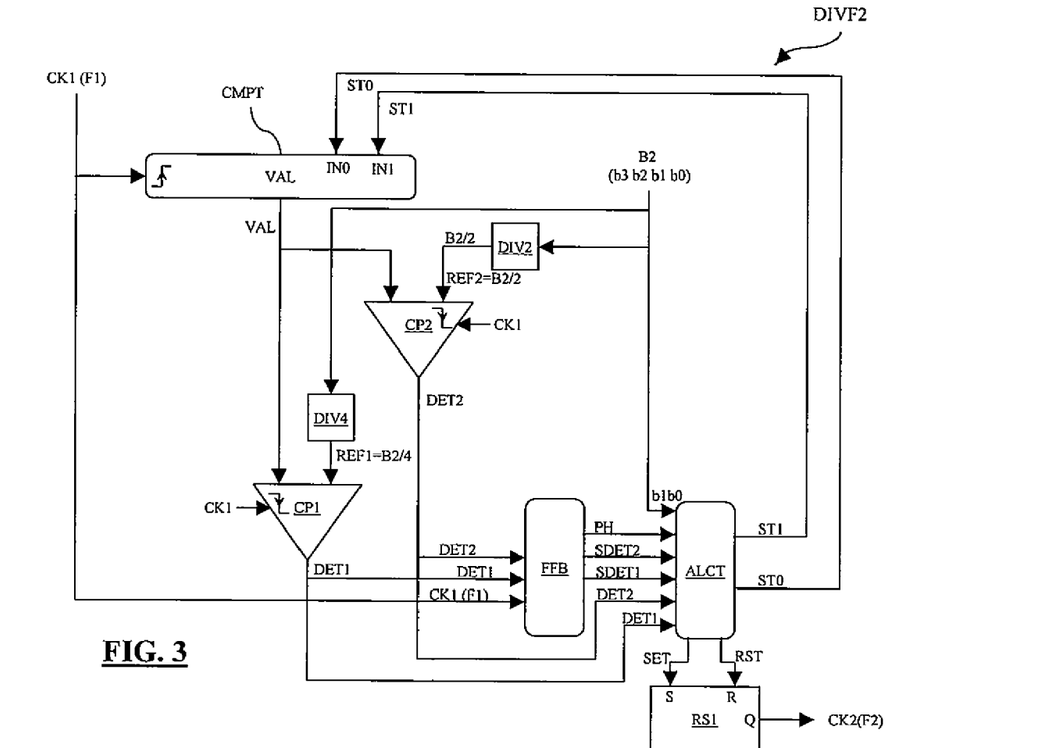
FIG. 3 represents a binary frequency divider according to the one embodiment.

FIG. 3 represents the structure of a frequency divider DIVF2 implementing the two aspects. The divider DIVF2 comprises a counter CMPT paced by an input signal CK1 of frequency F1, two synchronous logic comparators CP1, CP2 and an RS-type asynchronous flip-flop RS1 the Q output of which supplies a signal CK2 of frequency F2 forming the output signal of the divider.

The counting value VAL present in the counter CMPT, here of four bits, is applied to an input of the comparator CP1 and to an input of the comparator CP2. The comparator CP1 receives a threshold value REF1 at a second input and the comparator CP2 receives a threshold value REF2 at a second input, the threshold values also being coded on four bits. The comparator CP1 supplies a control signal DET1 and the comparator CP2 supplies a control signal DET2. The signals DET1, DET2 are here synchronized with the falling edges of the input signal CK1 whereas the counting value VAL is incremented in synchronization with the rising edges of the signal CK1.

According to one embodiment, the frequency divider comprises a synchronous block FFB supplying two additional control signals SDET1, SDET2. The signal SDET1 is shifted by a half-period of the signal CK1 in relation to the signal DET1 and the signal SDET2 is shifted by a half-period of the signal CK1 in relation to the signal DET2.

The signals DET1, DET2, SDET1 and SDET2 are applied to an asynchronous logic block ALCT that generates, using these signals, SET and RST signals. The SET signal is applied to the S input of the flip-flop RS1 as a set signal for setting to 1, while the RST signal is applied to the R input of the flip-flop RS1 as a reset signal for resetting to 0. The SET signal thus enables the output signal CK2 to be put to 1 (rising edge) and the RST signal enables it to be reset to 0 (falling edge).

The logic circuit ALCT can thus adjust the rising edges of the output signal CK2 with a precision of a half-period of the input signal CK1. Similarly, it can adjust the falling edges of the output signal CK2 with a precision of a half-period of the signal CK1.

The divider also comprises a binary divider DIV4 performing a division by 4 without any carry after the decimal point, and a binary divider DIV2 performing a division by 2 without any carry after the decimal point. Furthermore, the block FFB supplies the logic block ALCT with a phase signal PH and the logic block ALCT applies two distinct reset signals ST0, ST1 to the counter CMPT. The signal ST0 enables the counter to be reset with the value 0 (e.g., 0000 in binary) and the signal ST1 enables the counter to be reset with the value 1 (e.g., 0001 in binary). Finally, the logic block ALCT also receives the last two bits b1, b0 of the division setpoint B2, which it uses to generate the signals SET, RST, ST0 and ST1 in a manner described by Table 1 below and by FIG. 5.

The divider DIV4 receives the division setpoint B2 and performs two right shifts, by switching the bits b3, b2 of the setpoint B2 to the bits b1, b0 of the result B2/4, while resetting the bits b3, b2 of the result to 0. The divider DIV4 thus supplies the value B2/4 with a rounding error concerning the two least significant bits of the setpoint B1. The result B2/4 is applied to the comparator CP1 as a threshold value REF1.

The divider DIV2, the structure of which is represented in FIG. 1B, also receives the setpoint B2 and performs a right shift of the bits b3, b2, b1 of the setpoint B2, by resetting the bit b4 of the result B2/2 to 0. The divider DIV2 thus supplies the value B2/2 with a rounding error concerning the least significant bit of the division setpoint.

The value B2/4 is applied to the comparator CP1 as threshold value REF1 and the value B2/2 is applied to the comparator CP2 as threshold value REF2.

Figure 4:
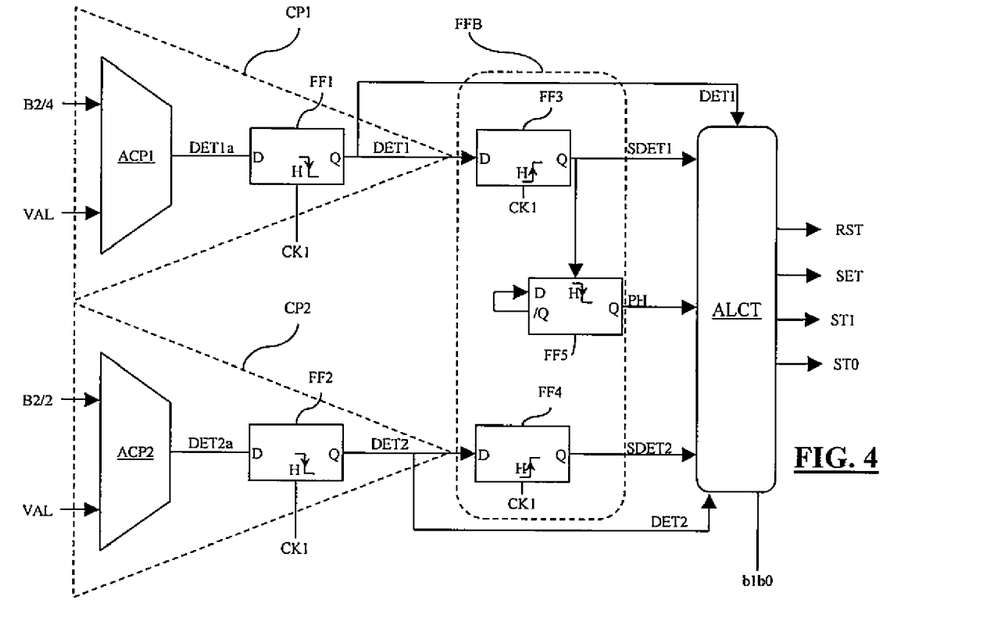
FIG. 4 is a more detailed view of the structure of certain elements present in the frequency divider according to the one embodiment.

FIG. 4 represents an example of an embodiment of the comparators CP1, CP2 and of the synchronous block FFB.

The comparator CP1 comprises an asynchronous comparator ACP1 receiving the values VAL and B2/4, and a synchronization flip-flop FF1 the clock input H of which receives the input signal CK1 and triggers the flip-flop FF1 on the falling edge of the signal CK1. The comparator ACP1 supplies a control signal DET1a at the D input of the flip-flop FF1. The Q output of the flip-flop FF1 supplies the control signal DET1, which is synchronized with the falling edges of the signal CK1 (the Q output copying the D input upon each falling edge).

Similarly, the comparator CP2 comprises an asynchronous comparator ACP2 receiving the values VAL and B2/2, and a synchronization flip-flop FF2 the clock input of which receives the signal CK1 and triggers the flip-flop FF2 on the falling edge of the signal CK1. The asynchronous comparator ACP2 supplies an asynchronous control signal DET2a and the Q output of the flip-flop FF2 supplies the control signal DET2 that is synchronized with the falling edges of the signal CK1.

The block FFB comprises three synchronous flip-flops FF3, FF4, FF5. The flip-flops FF3, FF4 are triggered when their clock input H receives a rising edge and the flip-flop FF5 is triggered when its clock input H receives a falling edge.

The flip-flop FF3 receives the signal CK1 at its clock input H and receives the signal DET1 at its D input. Its Q output supplies the control signal SDET1. Thus, the signal DET1 is copied on the Q output with a half-period delay, upon each rising edge of the signal CK1, so as to form the signal SDET1.

The flip-flop FF4 receives the signal CK1 at its clock input H and receives the signal DET2 at its D input. Its Q output supplies the control signal SDET2. Thus, the signal DET2 is copied on the Q output with a half-period delay, upon each rising edge of the signal CK1, so as to form the signal SDET2.

The flip-flop FF5 forms a divider by 2, its inverted /Q output being connected to its D input. Its clock input H receives the signal SDET2 and its Q output supplies the signal PH. The signal PH is therefore synchronized with the signal SDET2 and alternately changes to 0 or to 1 upon each falling edge of the signal SDET1.

Figure 5:
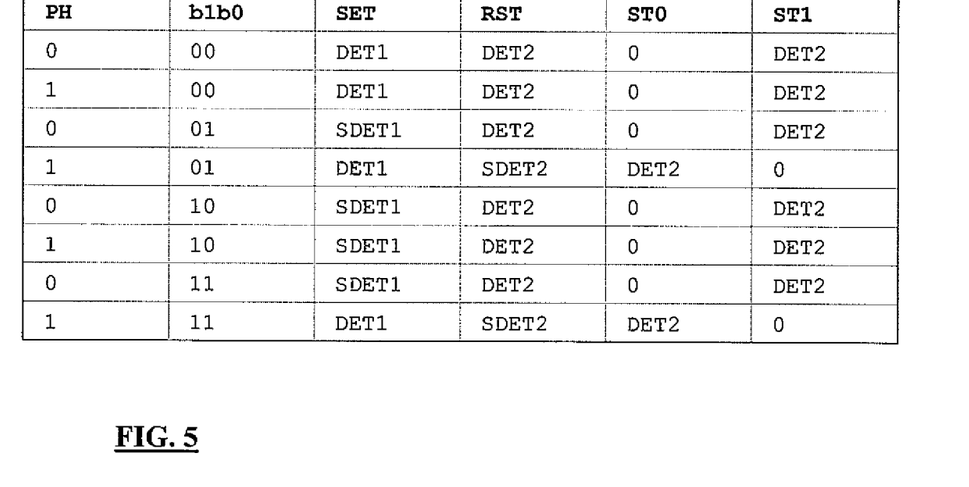
FIG. 5 is a truth table describing the operation of a logic control block present in the frequency divider according to one embodiment.

As it can be seen in Table 1, the signal PH enables the logic block ALCT to generate the control signals SET, RST for controlling the output signal in two distinct phases, each phase having the same duration as the period T2 of the output signal, so as to control with precision the temporal positioning of the rising and falling edges of the output signal CK2.

More particularly, the logic block ALCT chooses one of the control signals DET1, DET2, SDET3, SDET4 as SET and RST signals by taking into account firstly the signal PH and secondly the least significant bits b1, b0 of the division setpoint, so as to correct the rounding error on the two least significant bits made by the divider DV4 and the rounding error on the least significant bit made by the divider DIV2.

TABLE 1

(TRUTH TABLE OF THE LOGIC BLOCK ALCT)

| PH | b1 b0 | SET | RST | ST0 | ST1 |
|---|---|---|---|---|---|
| 0 | 00 | DET1 | DET2 | 0 | DET2 |
| 1 | 00 | DET1 | DET2 | 0 | DET2 |
| 0 | 01 | SDET1 | DET2 | 0 | DET2 |
| 1 | 01 | DET1 | SDET2 | DET2 | 0 |
| 0 | 10 | SDET1 | DET2 | 0 | DET2 |
| 1 | 10 | SDET1 | DET2 | 0 | DET2 |
| 0 | 11 | SDET1 | DET2 | 0 | DET2 |
| 1 | 11 | DET1 | SDET2 | DET2 | 0 |

In Table 1, four different cases can thus be distinguished:
1) b1 b0 = 00
2) b1 b0 = 01
3) b1 b0 = 10
4) b1 b0 = 11

In case 1, the divider operates classically (save the fact that the output frequency is doubled) as the setpoint is a multiple of 4 and no rounding error occurs when it is divided by 2 and by 4 by the dividers DIV2 and DIV4. Thus, it can be seen that the output signal is set to 1 by the signal DET1 (SET=DET1) and is reset to 0 by the signal DET2 (RST=DET2). Similarly, the counter is set to 1 by the signal DET2 (SET1=DET1).

In cases 2 and 4, the setpoint is an odd value and the rounding error therefore relates to the bit b0 or the two bits b1 and b0. During the first phase (PH=0), the logic block sets the output signal to 1 when the signal SDET1 appears (SET=SDET1) and resets the output signal to 0 when the signal DET2 appears (RST=DET2). During the second phase (PH=1), the logic block sets the output signal to 1 when the signal DET1 appears (SET=DET1) and resets the output signal to 0 when the signal SDET2 appears (RST=SDET2). The period T2 of the output signal is therefore identical during each phase and is equal to (N−0.5)*T1, N being a whole number representing the number of full periods T1 of the input signal elapsing between the instant DET1 changes to 1 and the instant DET2 changes to 1.

In case 3, the setpoint is an even value but the bit b1 is equal to 1, such that the rounding error only relates to the bit b1. During the first phase (PH=0), the logic block sets the output signal to 1 when the signal SDET1 appears (SET=SDET1)

and resets the output signal to 0 when the signal DET2 appears (RST=DET2). During the second phase (PH=1), the logic block sets the output signal to 1 when the signal SDET1 appears (SET=SDET1) and resets the output signal to 0 when the signal DET2 appears (RST=DET2). The period T2 of the output signal is therefore identical during each phase and is again of the type (N−0.5)*T1.

Table 1 also shows that the signal PH and the bits b1 b0 enable the logic block ALCT to generate the reset signals ST0, ST1 for resetting the counter, distinguishing the following cases:
- in cases 1 and 3 (even division setpoint), the counter is reset to 1 by the signal DET2 (ST1=DET2) as in a classic divider such as the one represented in FIG. 1A,
- in cases 2 and 4 (odd division setpoint), the counter is reset to 1 by the signal DET2 (ST1=DET2) during the first phase (PH=0) but is reset to 0 by the signal DET2 (ST0=DET2) during the second phase (PH=1).

Figure 6:
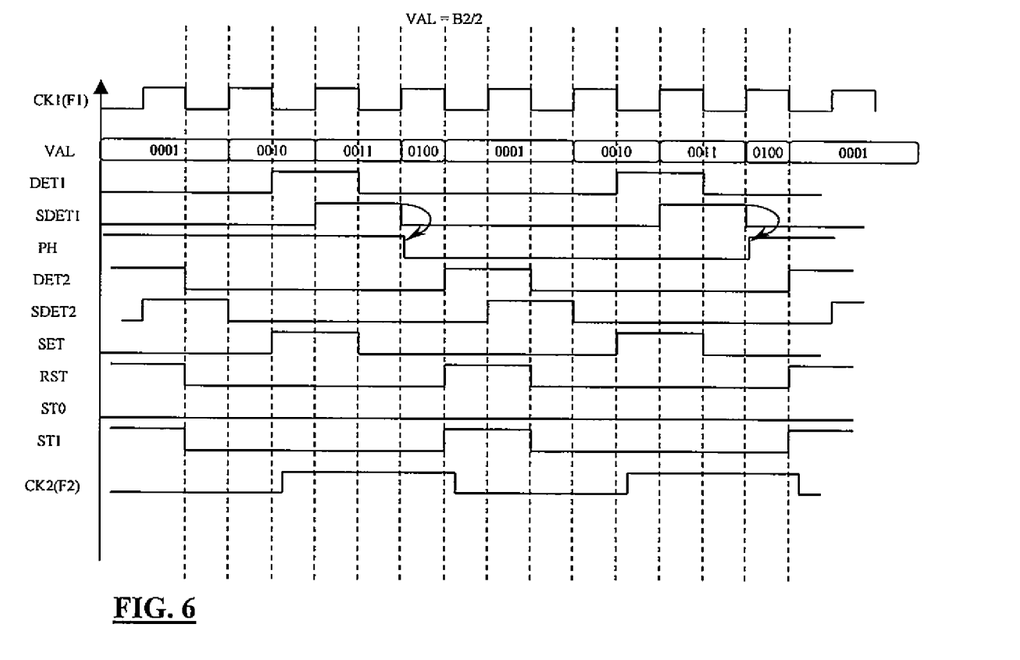
FIG. 6 is a timing diagram representing binary signals or values appearing in the frequency divider according to one embodiment, FIG. 7 schematically represents the structure of a UHF transponder of one embodiment.

To illustrate what has just been described, the timing diagram in FIG. 6 represents the shape of the signals CK1, DET1, SDET1, PH, DET2, SDET2, SET, RST, ST0, ST1, CK2 and the counting value VAL in the event that a division setpoint equal to 8 (1000) is applied to the frequency divider. It can be seen that the counting value does not exceed the value 4 due to the division by 2 of the setpoint B2 to generate the control signal DET2 (which determines the duration of the period of the output signal). Thus, the period T2 of the output signal is equal to 4*T1 instead of 8*T1, i.e., a doubled output frequency F2.

It will be noted in FIG. 6 that the counter is reset asynchronously by the signal ST1, before the appearance of the rising edge of the input signal CK1. Similarly, although not represented in this example, the counter is reset asynchronously by the signal ST0. Thus, when the next rising edge of the signal CK1 appears, the counting value VAL is not incremented since the signal ST1 (or ST0) is still on 1 and maintains it on 1 (or on 0). The duration of the counting value after reset is therefore substantially longer than that of the other counting values, and the duration of the last counting value before reset is substantially shorter than that of the other counting values. This characteristic is secondary. It is only due to purely technical reasons and has no impact on the output signal of the divider.

As indicated above, multiplying the output frequency by two enables an input frequency F1 to be applied to the divider according to the present invention that is equal to half the input frequency F0 that must be applied to the divider in FIG. 1A so as to obtain the same output signal CK2. The result is a lower current consumption of the divider.

An application of one embodiment will now be described in relation with FIGS. 7 and 8.

Figure 7:
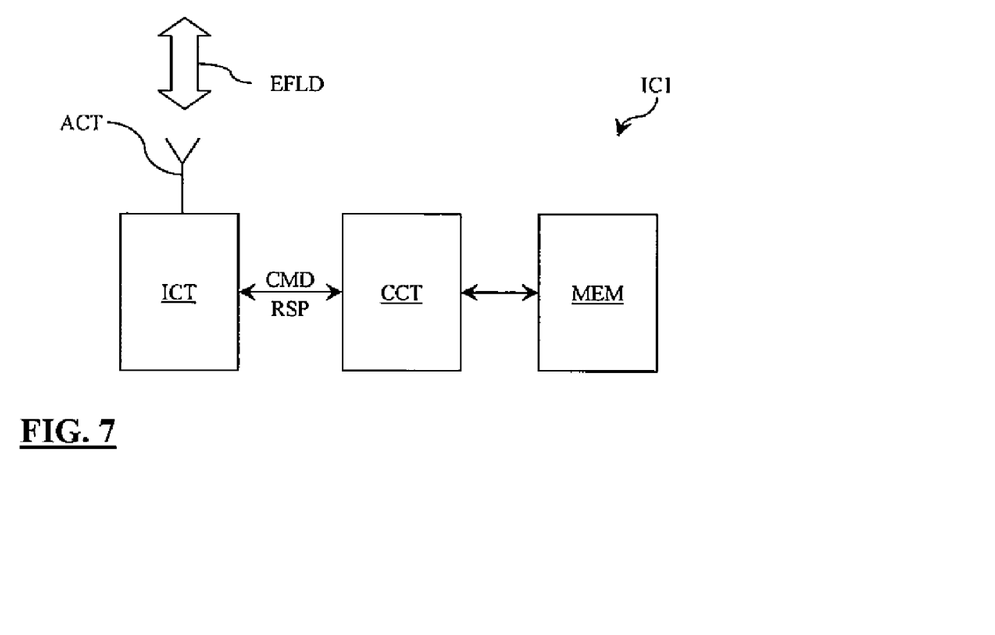

FIG. 7 schematically represents the structure of an embodiment of a contactless integrated circuit IC1. The integrated circuit IC1 is a passive UHF transponder comprising a contactless communication interface circuit ICT, a control circuit CCT and an electrically erasable and programmable (EEPROM or FLASH) memory MEM. The circuit ICT is linked to an antenna circuit ACT in dipole form enabling it to receive coded data by modulating an electric field EFLD oscillating at a UHF frequency, for example 800 MHz, the field EFLD being sent by a contactless integrated circuit reader. The circuit ICT also sends data, here by modulating the reflection coefficient of the antenna circuit ACT (backscattering technique). The control circuit CCT may be a hard-wired logic circuit.

The circuit CCT thus receives commands CMD via the interface circuit ICT (for example read or write commands for reading or writing the memory), and sends responses RSP via the circuit ICT. The contactless communication protocol used is for example defined by the industrial specification EPC™-GEN2.

Figure 8:
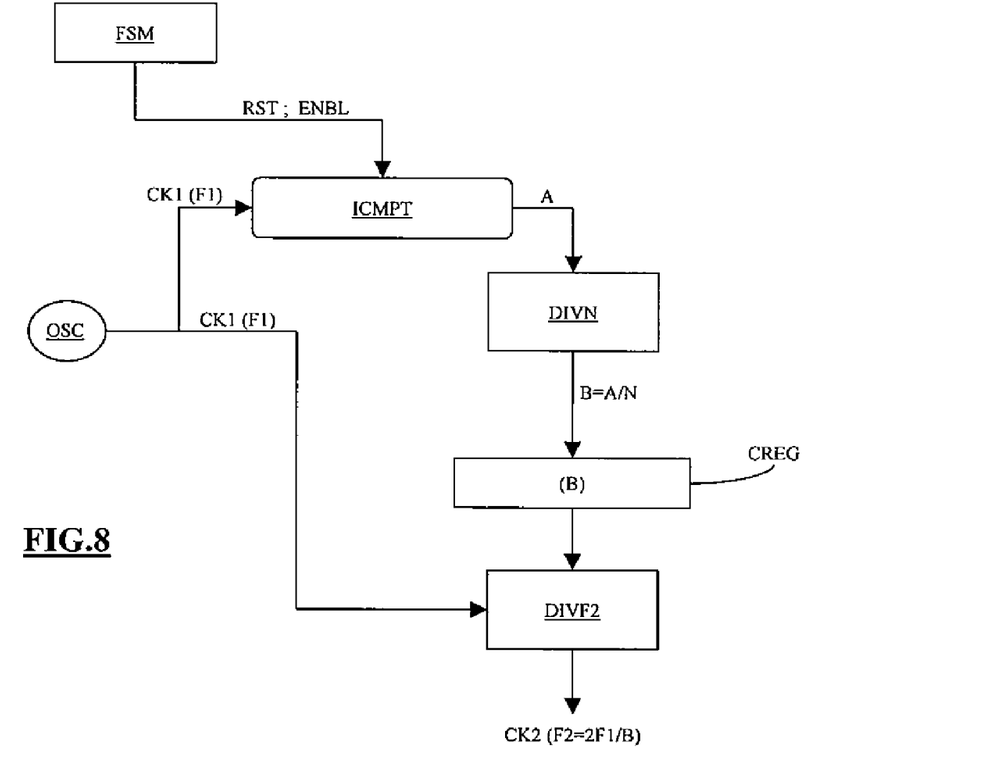
FIG. 8 represents a clock synchronization circuit present in the transponder in FIG. 7 and comprising a frequency divider according to one embodiment.

Inside the control circuit CCT, one embodiment of a synchronization circuit schematically shown in FIG. 8 is provided. The synchronization circuit comprises a counter ICMPT that is controlled by a logic machine FSM (Finite State Machine). For this purpose, the logic machine FSM applies a reset signal RST and a count enable signal ENBL to the counter. The counter is paced by a clock signal CK1 of frequency F1 supplied by an oscillator OSC. The counter supplies a counting value A.

The counting value A is applied to a divider DIVN that supplies the result B=A/N, N being a predetermined resynchronization value. The value B is stored by a setpoint register CREG and is applied to the frequency divider DIVF2 according to one embodiment, which receives the clock signal CK1 as an input signal. Thus, the divider DIVF2 supplies the signal CK2 of frequency F2=2F1/B.

The logic machine FSM activates the counter ICMPT by taking the signal ENBL to 1, upon detecting a determined event, such as the receipt of a synchronization frame for example (dc signal on 1 received via the interface ICT), and resets the signal ENBL to 0 when the event is no longer detected. When the counting is finished, the value A/N supplied by the divider DIVN is used by the integrated circuit to generate the signal CK2 the period of which T2 is equal to B*T1/2, i.e., (A/N*T1)/2, with T1=1/F1. The signal CK2 is therefore synchronized with an external clock signal having been used to generate the synchronization signal (for example the clock signal of a contactless integrated circuit reader). The synchronized signal CK2 is for example used as sub-carrier for backscattering steps enabling the integrated circuit to send back data via the antenna circuit ACT.

In such an application, a feature of an embodiment is that the frequency F1 of the internal clock signal CK1 of the transponder can be divided by 2 to obtain the synchronized frequency F2. The result is a lower consumption of electrical energy. As the transponder is electrically powered by the ambient electrical field, such current consumption saving improves the global performance of the transponder and particularly its maximum distance of communication with a reader.

Various other applications and alternative embodiments may be made. Particularly, as indicated above, but not exclusively, the first aspect of one embodiment can be used to produce a frequency divider having no error on the duty cycle, the output frequency of which is equal to F1/B and is not doubled as above. In this case, the signals PH, ST0, DET2 are not necessary. The truth table of the block ALCT can then comply with Table 2 below.

TABLE 2

| (ALTERNATIVE OF THE TRUTH TABLE OF THE LOGIC BLOCK ALCT) | | | |
| --- | --- | --- | --- |
| b0 | SET | RST | ST1 |
| 0 | DET1 | DET2 | DET2 |
| 1 | SDET1 | DET2 | DET2 |

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A method for dividing an input frequency of an input signal and supplying an output signal having a frequency lower than the input frequency, the method comprising:
    defining a division setpoint;
    defining a first threshold value and a second threshold value that vary according to the division setpoint;
    incrementing a counting value at a pace of the input signal;
    comparing the counting value with the first threshold value and with the second threshold value and producing, in synchronization with variation edges of a first type of the input signal, a first control signal and a second control signal;
    producing at least one third control signal shifted by a half-period of the input signal in relation to one of the first or second control signals; and
    generating the output signal using at least one of said control signals chosen according to a value of at least one least significant bit of the division setpoint, so as to adjust a period of the output signal or a duty cycle of the output signal with a precision at least equal to the half-period of the input signal.

2. The method according to claim 1 wherein said producing said at least one third control signal includes:
    producing a third control signal shifted by the half-period of the input signal in relation to the first control signal;
    producing a fourth control signal shifted by the half-period of the input signal in relation to the second control signal; and
    producing a fifth control signal of a frequency equal to half the frequency of the output signal; and
    wherein said generating the output signal using at least one of said control signals includes:
    generating the output signal using control signals chosen from the first, second, third, and fourth control signals according to a value of at least two least significant bits of the division setpoint and of a value of the fifth control signal.

3. The method according to claim 2, further comprising cyclically resetting the counting value to 0 or to 1 according to the value of the least significant bits of the division setpoint and to the value of the fifth control signal.

4. The method according to claim 2 wherein the output signal is controlled by an asynchronous hard-wired logic circuit receiving at input the first, second, third, fourth, and fifth control signals and at least the at least one significant bit of the division setpoint, and supplying reset signals and set signals to set and reset the output signal respectively to 0 and to 1.

5. The method according to claim 2 wherein:
    the frequency of the output signal is equal to the frequency of the input signal divided by the division setpoint and multiplied by two;
    the first threshold value is equal to a result of a binary division by 4 of the division setpoint, without any carry after a decimal point; and
    the second threshold value is equal to a result of a binary division by 2 of the division setpoint, without any carry after a decimal point.

6. The method according to claim 1 wherein:
    the frequency of the output signal is equal to the frequency of the input signal divided by the division setpoint;
    the first threshold value is equal to a result of a binary division by 2 of the division setpoint, without any carry after a decimal point; and
    the second threshold value is equal to the division setpoint.

7. A hard-wired logic binary frequency divider, receives an input signal having an input frequency and to supply an output signal having a frequency lower than the input frequency, the divider comprising:
    an input terminal to receive a division setpoint;
    a counter paced by the input signal and containing a counting value;
    means for supplying a first and a second threshold value according to the division setpoint;
    means for comparing the counting value with the first and second threshold values and supplying first and second control signals synchronized with variation edges of a first type of the input signal;
    means for supplying at least one third control signal shifted by a half-period of the input signal in relation to one of the first or second control signals; and
    control means for generating the output signal using at least one of said control signals chosen according to a value of at least one least significant bit of the division setpoint, such that a period of the output signal or a duty cycle of the output signal is adjusted with a precision at least equal to the half-period of the input signal.

8. The divider according to claim 7 wherein said means for supplying said at least one third control signal includes:
    means for supplying a third control signal shifted by the half-period of the input signal in relation to the first control signal;
    means for supplying a fourth control signal shifted by the half-period of the input signal in relation to the second control signal; and
    means for producing a fifth control signal of a frequency equal to half the frequency of the output signal;
    and wherein the control means are arranged for generating the output signal using control signals chosen from the first, second, third, and fourth control signals according to a value of at least two least significant bits of the division setpoint and of the value of the fifth control signal.

9. The divider according to claim 8 wherein the control means supply signals so as to cyclically reset the counter with the counting value equal to 0 or equal to 1 according to the value of the least significant bits of the division setpoint and of the value of the fifth control signal.

10. The divider according to claim 8 wherein the control means include an asynchronous hard-wired logic circuit receiving at input the first, second, third, fourth, and fifth control signals and at least the at least one significant bit of the division setpoint, and supplying reset signals and set signals for resetting and setting the output signal respectively to 0 and to 1.

11. The divider according to claim 8 wherein:
(a) said means for supplying said first and said second threshold value include:
a first binary divider to supply the first threshold value using the division setpoint and
a second binary divider to supply the second threshold value using the division setpoint;
(b) said means for comparing the counting value with the first and second threshold values include:
a first logic comparator synchronized with the variation edges of the first type of the input signal, to supply the first control signal when the counting value is equal to the first threshold value; and
a second logic comparator synchronized with the variation edges of the first type of the input signal, to supply the second control signal when the counting value is equal to the second threshold value;
(c) said means for supplying said at least one third control signal include:
a first flip-flop synchronized with variation edges of a second type of the input signal, to receive the first control signal and to supply the third control signal;
a second flip-flop synchronized with the variation edges of the second type of the input signal, to receive the second control signal and to supply the fourth control signal; and
a divider by two synchronized with the variation edges of the second type of the input signal, to receive the third control signal and to supply the fifth control signal.

12. The divider according to claim 8 wherein:
the frequency of the output signal is equal to the frequency of the input signal divided by the division setpoint and multiplied by two;
the first threshold value is equal to a result of a binary division by 4 of the division setpoint without any carry after a decimal point and
the second threshold value is equal to a result of a binary division by 2 of the division setpoint without any carry after a decimal point.

13. The divider according to claim 7 wherein:
the frequency of the output signal is equal to the frequency of the input signal divided by the division setpoint;
the first threshold value is equal to a result of the binary division by 2 of the division setpoint, without any carry after a decimal point; and
the second threshold value is equal to the division setpoint.

14. An integrated circuit, comprising passive transponder having the divider according to claim 7.

15. The integrated circuit according to claim 14 wherein:
the input signal of the divider is an internal clock signal;
the divider is arranged to supply said output signal, the frequency of which is equal to the input frequency divided by the division setpoint and multiplied by two; and
the division setpoint is supplied by a counting circuit to count a number of periods of the internal clock signal occurring during an external event, divided by a particular value.

16. An apparatus receives an input signal having an input frequency and to supply an output signal having an output frequency, the apparatus comprising:
an input terminal to receive a division setpoint;
a counter controlled by the input signal to provide a counting value;
first and second divide circuits, coupled to said input terminal to receive said division setpoint, to respectively supply first and second threshold values according to the division setpoint;
first and second compare circuits, coupled to said counter and respectively to said first and second divide circuits, to compare the counting value with the first and second threshold values and to supply first and second control signals synchronized with variation edges of a first type of the input signal;
a synchronous circuit, coupled to said first and second compare circuits, to supply at least one third control signal shifted by a half-period of the input signal relative to one of the first or second control signals; and
an asynchronous control circuit, coupled to said synchronous circuit, to generate the output signal using at least one of said control signals chosen according to a value of at least one least significant bit of the division setpoint.

17. The apparatus of claim 16 wherein said at least one of said control signals is chosen according to said value of at least one least significant bit of the division setpoint, such that a period of the output signal or a duty cycle of the output signal can be adjusted with a precision at least equal to the half-period of the input signal.

18. The apparatus of claim 16 wherein said synchronous circuit to supply said at least one third control signal includes:
a first flip-flop, coupled to said first compare circuit, to supply a third control signal shifted by the half-period of the input signal relative to the first control signal;
a second flip-flop, coupled to said second compare circuit, to supply a fourth control signal shifted by the half-period of the input signal relative to the second control signal; and
a third flip-flop, coupled to said first flip-flop, to produce a fifth control signal of a frequency equal to half the frequency of the output signal.

19. The apparatus of claim 18 wherein said asynchronous control circuit is adapted to generate the output signal using control signals chosen from the first, second, third, and fourth control signals according to a value of at least two least significant bits of the division setpoint and of the value of the fifth control signal.

20. The apparatus of claim 16 wherein:
said first compare circuit includes a first asynchronous comparator having first and second input terminals to respectively receive the counting value and the first threshold value, and having a first synchronization flip-flop coupled to an output terminal of said first asynchronous comparator, the first synchronization flip-flop having a clock input terminal to receive the input signal that triggers the first synchronization flip-flop on falling edges of the input signal, the first synchronization flip-flop having an output terminal to supply the first control signal, which is synchronized with the falling edges of the input signal; and
said second compare circuit includes a second asynchronous comparator having first and second input terminals to respectively receive the counting value and the second threshold value, and having a second synchronization flip-flop coupled to an output terminal of said second asynchronous comparator, the second synchronization flip-flop having a clock input terminal to receive the input signal that triggers the second synchronization flip-flop on the falling edges of the input signal, the second synchronization flip-flop having an output terminal to supply the second control signal, which is synchronized with the falling edges of the input signal.

21. An integrated circuit card system, comprising:
an antenna circuit;
a contactless communication interface circuit coupled to said antenna circuit;
a control circuit coupled to said communication interface circuit; and
a memory coupled to said control circuit, wherein said control circuit includes:
an input terminal to receive a division setpoint;
a counter controlled by an input signal having an input frequency and adapted to provide a counting value;
a divide circuit, coupled to said input terminal to receive said division setpoint, to supply first and second threshold values according to the division setpoint;
a compare circuit, coupled to said counter and to said divide circuit, to compare the counting value with the first and second threshold values and to supply first and second control signals synchronized with variation edges of a first type of the input signal;
a synchronous circuit, coupled to said compare circuit, to supply at least one third control signal shifted by a half-period of the input signal relative to one of the first or second control signals; and
an asynchronous control circuit, coupled to said synchronous circuit, to generate the output signal using at least one of said control signals chosen according to a value of at least one least significant bit of the division setpoint.

22. The system of claim 21 wherein said synchronous circuit to supply said at least one third control signal includes:
a first flip-flop, coupled to said compare circuit, to supply a third control signal shifted by the half-period of the input signal relative to the first control signal;
a second flip-flop, coupled to said compare circuit, to supply a fourth control signal shifted by the half-period of the input signal relative to the second control signal; and
a third flip-flop, coupled to said first flip-flop, to produce a fifth control signal of a frequency equal to half the frequency of the output signal.

23. The system of claim 22 wherein said asynchronous control circuit is adapted to generate the output signal using control signals chosen from the first, second, third, and fourth control signals according to a value of at least two least significant bits of the division setpoint and of the value of the fifth control signal.

24. The system of claim 21 wherein said compare circuit includes:
a first asynchronous comparator having first and second input terminals to respectively receive the counting value and the first threshold value;
a first synchronization flip-flop coupled to an output terminal of said first asynchronous comparator, the first synchronization flip-flop having a clock input terminal to receive the input signal that triggers the first synchronization flip-flop on falling edges of the input signal, the first synchronization flip-flop having an output terminal to supply the first control signal, which is synchronized with the falling edges of the input signal;
a second asynchronous comparator having first and second input terminals to respectively receive the counting value and the second threshold value; and
a second synchronization flip-flop coupled to an output terminal of said second asynchronous comparator, the second synchronization flip-flop having a clock input terminal to receive the input signal that triggers the second synchronization flip-flop on the falling edges of the input signal, the second synchronization flip-flop having an output terminal to supply the second control signal, which is synchronized with the falling edges of the input signal.

* * * * *